United States Patent [19]

Jesse et al.

[11] 3,958,186

[45] May 18, 1976

[54] WIDEBAND PHASE LOCKED LOOP TRANSMITTER SYSTEM

[75] Inventors: James Edward Jesse, Oakland; James V. Motsinger, Plantation; George Revtai, Jr., Hollywood; Jose Suarez, Miami, all of Fla.

[73] Assignee: Motorola, Inc., Chicago, Ill.

[22] Filed: Mar. 10, 1975

[21] Appl. No.: 556,617

[52] U.S. Cl. .................................. 331/4; 307/228; 325/178; 325/184; 328/183; 331/8; 331/17; 331/25
[51] Int. Cl.² ........................................ H03B 3/04
[58] Field of Search ................ 331/4, 8, 17, 18, 25; 325/178, 184; 307/228; 328/181, 183

[56] References Cited
UNITED STATES PATENTS

| | | | |
|---|---|---|---|
| 3,091,740 | 5/1963 | Murphy, Jr. | 331/4 |
| 3,421,105 | 1/1969 | Taylor | 331/4 |
| 3,514,632 | 5/1970 | Henderson et al. | 307/228 |
| 3,621,281 | 11/1971 | Hagen | 328/183 X |
| 3,793,594 | 2/1974 | Griswold | 331/4 |

*Primary Examiner*—Siegfried H. Grimm
*Attorney, Agent, or Firm*—James W. Gillman; Eugene A. Parsons

[57] ABSTRACT

A phase locked loop including a reference oscillator connected to one input of a loop phase detector the output of which is connected through an integrating low pass filter to a voltage controlled oscillator with the output of the voltage controlled oscillator being mixed with a second frequency and compared to the reference in the loop phase detector. The mixer output is also compared to an output of the reference oscillator shifted 90° in a quadrature phase detector, the output of which controls a lock detector which in turn controls a fixed current sink. The fixed current sink is connected to the integrating low pass filter when the loop is in an unlocked condition so that a linear voltage, ramp signal is applied to the voltage controlled oscillator from the output of the integrating low pass filter. An RF gate attenuates the voltage controlled oscillator output until lock is achieved and subsequent power amplifiers are in operation at which time the RF gate gradually connects the power amplifiers to the output of the voltage controlled oscillator.

8 Claims, 4 Drawing Figures

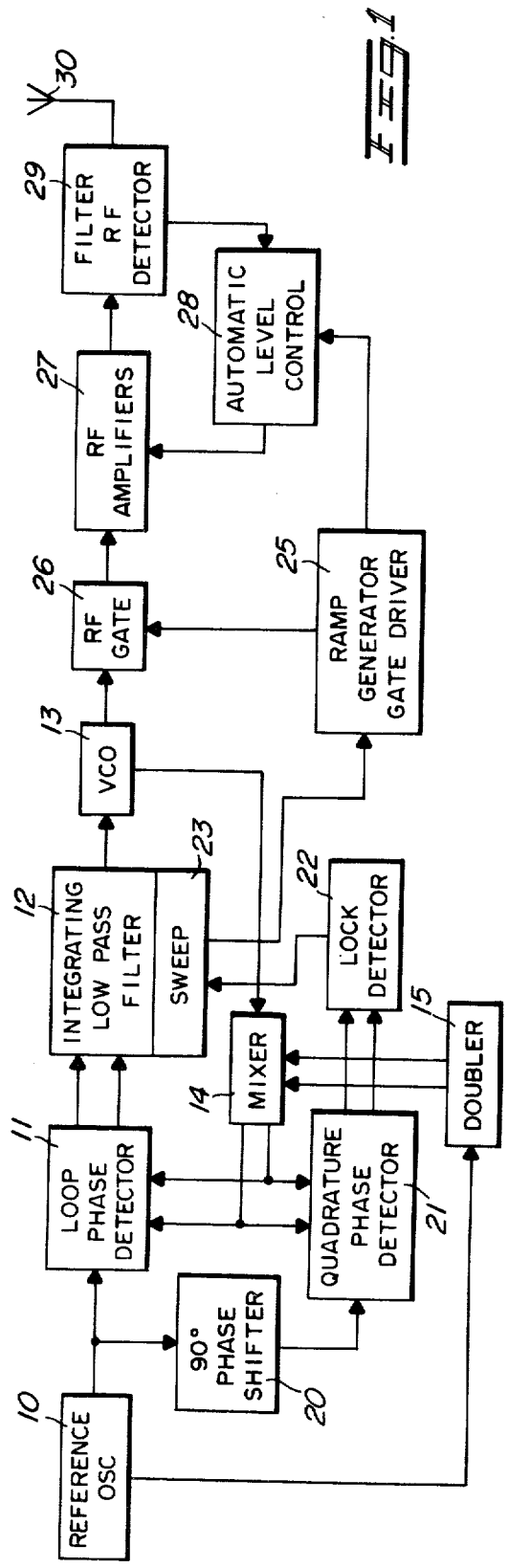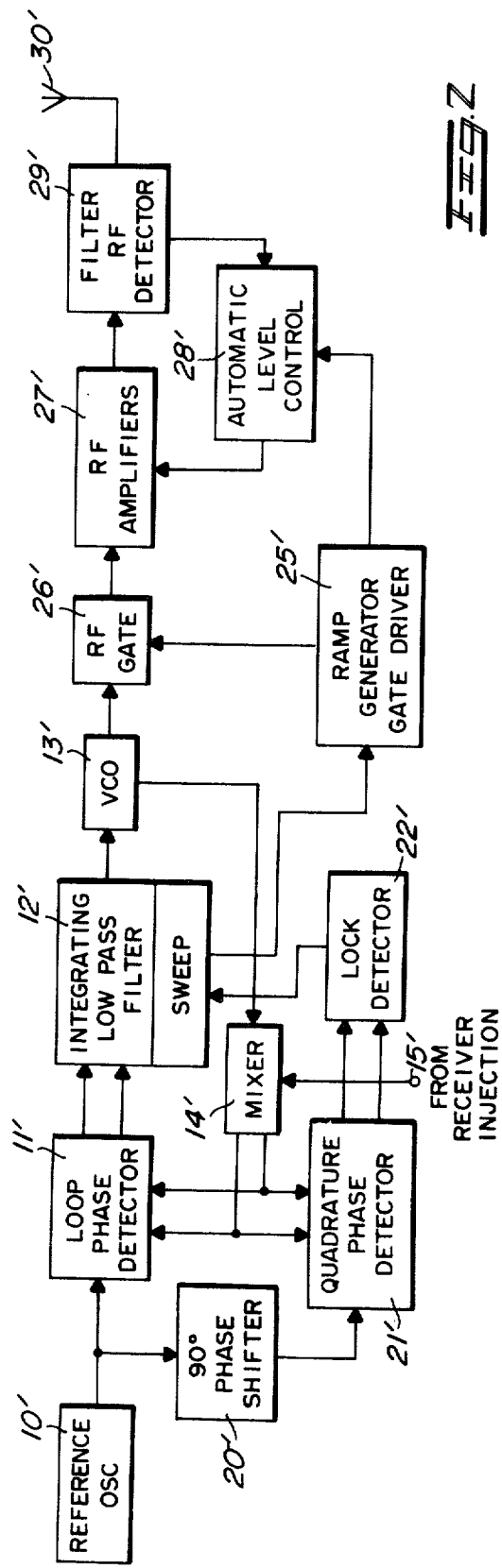

WIDEBAND PHASE LOCKED LOOP TRANSMITTER SYSTEM

BACKGROUND OF THE INVENTION

The present invention pertains to a phase locked loop and particularly to the use of a phase locked loop in a transmitting system. Phase locked loops traditionally are utilized to stabilize the output frequency of a voltage controlled oscillator relative to a fixed and stable reference oscillator. Generally, the voltage controlled oscillator is operating at a substantially different frequency from the reference oscillator and the signals from the two oscillators are altered, by multiplying, dividing, mixing with another frequency, etc., so that the frequencies are equal and the phases of the two equal frequency signals are compared in a phase detector. The output of the phase detector, which may be a simple DC control voltage, may then be utilized to control the frequency of the voltage controlled oscillator. However, in most systems care must be utilized to ensure that the voltage controlled oscillator does not lock on an undesired harmonic frequency of the reference oscillator. Also, when the load on the voltage controlled oscillator changes the voltage controlled oscillator has a tendency to jump out of lock. Circuits have been devised which cause the frequency of the voltage controlled oscillator to sweep through a band of frequencies, including the desired operating frequency, but the sweep voltage must be cancelled when the voltage controlled oscillator attains lock, which generally means that the loop hunts slightly or operates with something less than the optimum characteristics.

The present invention solves these problems by providing a novel integrator, low pass filter circuit having a sweep circuit connected thereto to provide a linear ramp output during unlock conditions in the loop and providing a quadrature phase detector and lock detector to supply an accurate indication of a lock condition in the loop to deactivate the sweep circuit. Further, the output of the voltage controlled oscillator is supplied to power amplifiers and the like through an RF gate which is turned on gradually by a ramp generator only after the loop has attained the lock condition and the power amplifiers and the like have been turned on. Thus, the loop phase detector operates at the center of its transfer characteristic, which results in a constant phase detector gain and maintains the loop operating with optimum characteristics while preventing sudden loads from being applied to the voltage controlled oscillator and causing it to jump out of lock.

SUMMARY OF THE INVENTION

The present invention pertains to a phase locked loop including a reference oscillator, loop phase detector, integrating low pass filter, voltage controlled oscillator, mixer and a source of signal having a frequency separated from the frequency of the output signal of the voltage controlled oscillator by the frequency of the output signal of the reference oscillator all connected in a phase locked loop with sweep signal producing means connected to the low pass filter and controlled by a lock detector for providing a substantially linear ramp voltage at the output of the low pass filter when the loop is in an unlocked condition and the output of the voltage controlled oscillator being applied to a load through an RF gate which is controlled by a ramp generator in turn controlled by the lock detector to provide a ramp to turn the gate on gradually once the loop has reached a lock condition.

It is an object of the present invention to provide a phase locked loop with improved operating characteristics.

It is a further object of the present invention to provide a phase locked loop with a novel sweep circuit therein which operates to cause the voltage controlled oscillator to sweep only when the loop is in an unlocked condition.

It is a further object of the present invention to provide a phase locked loop with means of gradually applying a load to the voltage controlled oscillator to prevent the oscillator from jumping out of lock.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures:

FIG. 1 is a block diagram of a phase locked loop transmitting system embodying the present invention;

FIG. 2 is another embodiment of the phase locked loop transmitting system illustrated in FIG. 1.

DESCRIPTION OF THE PREFERRED EMBODIMENTS

Figure 3A:
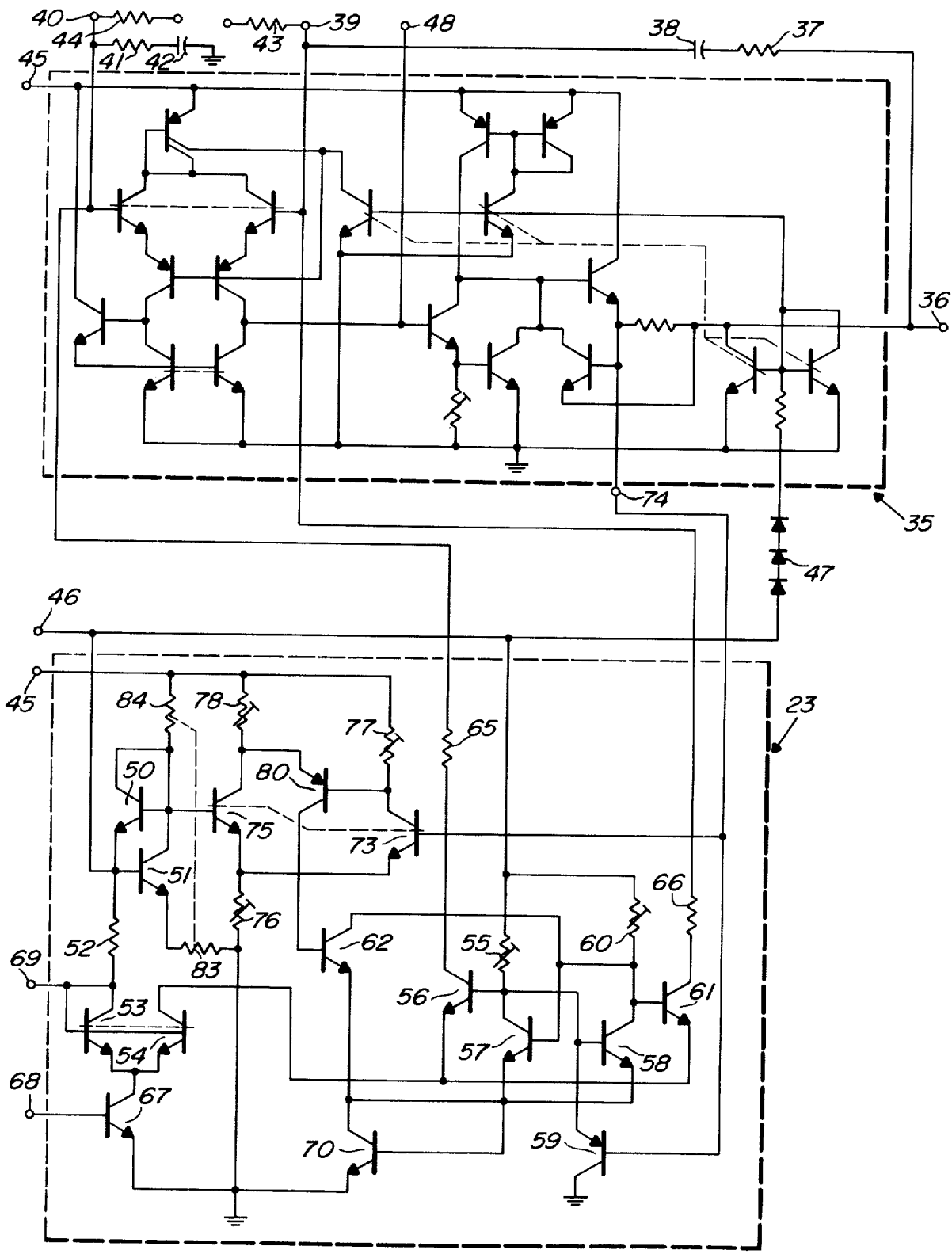
FIGS. 3A and 3B are schematic diagrams of portions of the transmitting system illustrated in FIG. 1.

Referring specifically to FIG. 1, a reference oscillator, designated 10, supplies an output signal having a predetermined frequency to one input of a loop phase detector 11. The output of the loop phase detector 11 is applied through an integrating low pass filter and DC amplifier 12 to a voltage controlled oscillator 13. In the present embodiment, the output of the loop phase detector 11 is illustrated as a pair of output leads because the loop phase detector 11 provides differential outputs. Differential inputs and outputs are utilized in the present design to provide good common mode rejection and to ensure that the gain of various stages remains constant over large supply variations, but it should be understood that other types of circuits might be utilized by those skilled in the art. The output of the voltage controlled oscillator 13 is applied to a mixer 14 which receives a second, differential input from a doubler circuit 15. The output of the mixer 14, which is illustrated as a differential output, is applied to a second input of the loop phase detector 11 to complete the phase locked loop. The doubler 15 receives a signal from the reference oscillator 10 to provide the signal to the mixer 14 having a frequency separated from the frequency of the output signal of the voltage controlled oscillator 13 by the frequency of the output signal of the reference oscillator 10. For example, the reference oscillator 10 may be operating at a frequency of approximately 50 megahertz and the voltage controlled oscillator 13 may be operating at a frequency of approximately 150 megahertz so that the doubler 15 supplies a signal to the mixer 14 having a frequency of approximately 100 megahertz.

The output of the reference oscillator 10 is also applied through a 90° phase shifting network 20 to one input of a quadrature phase detector 21. A second, differential input to the quadrature phase detector 21 is supplied by the mixer 14. The output of the quadrature phase detector 21, which in this embodiment is a differential output, is applied to a lock detector 22 which has an output that is applied to a sweep circuit 23. The sweep circuit 23 is coupled to the low pass filter and DC amplifier 12 to cause the low pass filter and DC amplifier 12 to supply a linear ramp voltage to the input of the voltage controlled oscillator 13 when the lock detector 22 indicates that the phase locked loop is in an unlocked condition. The operation of this circuitry will be described in more detail presently.

The lock detector 22 also supplies an indication of a lock condition in the phase locked loop through the sweep circuit 23 to a delay, ramp generator and gate driver circuit 25. The circuit 25 in turn controls and RF gate 26 which attenuates the output of the voltage controlled oscillator 13 when the loop is unlocked and supplies the output signal of the voltage controlled oscillator 13 to power amplifiers 27 when it is activated (the loop is locked). In addition, the circuit 25 supplies a signal to an automatic level control circuit 28 which turns off the power amplifiers 27 when the phase locked loop is in an unlocked condition and turns on the power amplifiers 27 when the phase locked loop is in a locked condition. The output of the power amplifiers 27 is supplied through a filter 29 to an antenna 30. The output of the power amplifiers 27 is also detected in an RF detector associated with the filters 29 and the detected signal is fed back to the automatic level control circuit 28 to supply a control to the circuit 27 when an indication of a lock condition is supplied to the circuit 25. Since the power amplifiers 27, automatic level control 28 and filter and RF detector 29 do not form a portion of this invention, no further disclosure of these circuits will be made.

Referring specifically to FIG. 2, wherein similar parts are designated with similar numbers and all of the parts have a prime added to indicated a second embodiment, a phase locked loop including a reference oscillator 10', loop phase detector 11', low pass filter and DC amplifier 12', voltage controlled oscillator 13' and mixer 14', is illustrated. However, the means providing a second signal to the mixer 14' includes a terminal 15' connected to the receiver injection circuit (not shown). In this circuit the mixer receives a signal from the receiver injection circuit having a frequency separated from the frequency of the output signal of said voltage controlled oscillator by the frequency of the output signal of said reference oscillator. For example, the frequency of the signal applied to the terminal 15' may be approximately 420 megahertz and the reference oscillator 10' may be operating at approximately 21.4 megahertz in which case the voltage controlled oscillator 13' will be operating at approximately 441.4 megahertz. These frequencies are of course only exemplary and are not intended to limit this invention in any way. In the embodiment illustrated in FIG. 1 the frequency of the system is changed by substituting a crystal having a different frequency in the reference oscillator 10 while the frequency of the second system is changed by substituting a different crystal in the receiver injection circuit (not shown), which second system provides a saving in channel elements because a single crystal is used. Other signal providing means for supplying the second signal to the mixer 14 may be devised by those skilled in the art and the two embodiments illustrated are simplified means illustrated for exemplary purposes.

Figure 3B:
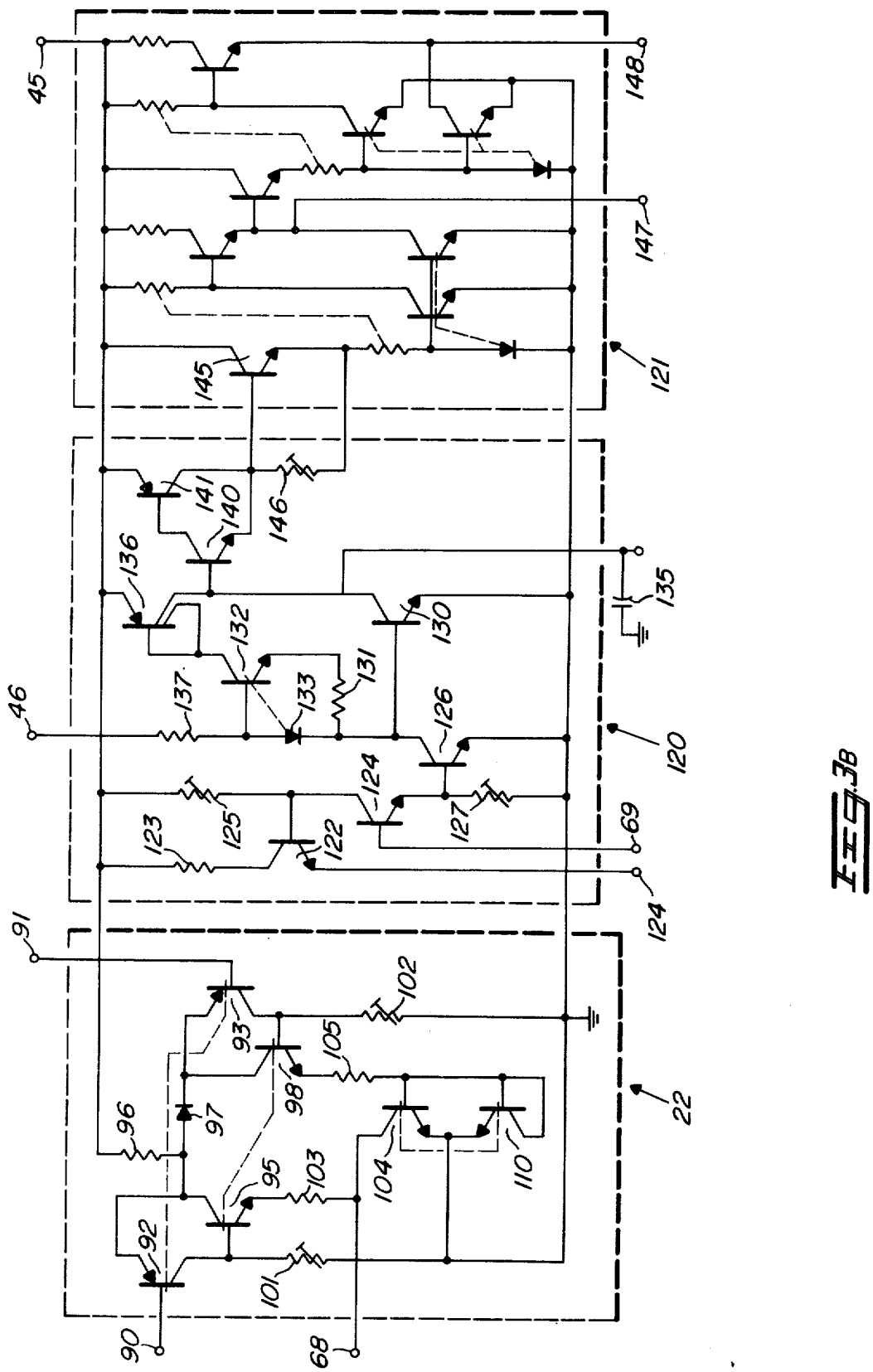

The schematic diagrams illustrated in FIGS. 3A and 3B illustrate a portion of the circuitry of the system illustrated in FIG. 1 which is formed on a single IC chip. The 90° phase shifter 20, the loop phase detector 11 and the quadrature phase detector 21 are also formed on the chip but are not illustrated in FIGS. 3A and 3B because they are relatively standard circuits well known to those skilled in the art. While the circuits illustrated are designed specifically for integrated circuits, it should be understood that other embodiments of the circuits might be devised by those skilled in the art if an integrated circuit is not a requirement.

Referring specifically to FIG. 3A, the numeral 35 generally refers to an operational amplifier which is constructed and operates in a generally standard manner so that a complete description of the internal construction and operation will not be provided. The operational amplifier 35 has an output terminal 36 connected through a series connected resistor 37 and capacitor 38 to a negative or inverting input terminal 39. A series connected resistor 41 and capacitor 42 are connected between a positive input terminal 40 and ground. A pair of resistors 43 and 44 are connected in series with the input terminals 39 and 40, respectively, and the output terminals of the loop phase detector 11. The resistors 37, 41, 43 and 44 and the capacitors 38 and 42 will not generally be formed as a portion of the IC circuit and are external thereto. Further, with the addition of the resistors 37, 43, 44 and 41 and the capacitors 38 and 42 the operational amplifier 35 forms the integrating low pass filter and DC amplifier 12 of FIG. 1. As illustrated in FIG. 1, the output terminal 36 is connected to the input of the voltage controlled oscillator 13 and the input terminals 39 and 40 are connected through resistors 43 and 44 to the output terminals of the loop phase detector 11. A positive voltage is applied to the operational amplifier 35 on a terminal 45 and a regulated positive supply is connected to the operational amplifier 35 by way of a terminal 46 and a string of series connected diodes 47. Compensation is applied to the operational amplifier 35 in the normal manner by way of a terminal 48.

The sweep circuit 23 is shown schematically within the dotted lines designated 23 in FIG. 3A. The terminal 46, having the regulated supply attached thereto (not shown), is connected through a first line to the emitter of an npn type transistor 50, the base of an npn type transistor 51 and through a resistor 52 to the base and collector of an npn type transistor 53 and the base of an npn type transistor 54. The terminal 46 is connected through a second line and through a resistor 55 to the base of an npn type transistor 56, the collector of an npn type transistor 57, the base of an npn type transistor 58 and the emitter of a npn type transistor 59 and through a second resistor 60 to the base of the transistor 57, the collector of the transistor 58, the base of an npn type transistor 61 and the collector of an npn type transistor 62. The collector of the transistor 56 is connected through a resistor 65 to the positive input 40 of the operational amplifier 35. The collector of the transistor 61 is connected through a resistor 66 to the negative input 39 of the amplifier 35. The emitters of the transistors 56 and 61 are connected together and to the collector of the transistor 54. The emitters of the transistors 53 and 54 are connected through the collector to emitter junction of an npn type transistor 67 to ground. The base of the transistor 67 is connected to an input terminal 68, which terminal receives an input signal from the lock detector 22 (see FIG. 3B). The common bases of the transistors 53 and 54 are connected to an output terminal 69 which is in turn connected to the ramp generator 25, as will be described in conjunction with FIG. 3B. The emitters of transistors 57 and 58 are connected together and to the collector and base of an npn type transistor 70, the emitter of which is connected to ground. The emitter of transistor 62 is also connected to the common collector and base of transistor 70. The collector of the transistor 59 is connected directly to ground and the base is connected to the base of an npn type transistor 73 and to the output of the operational amplifier 35 on a terminal 74. The emitter of the transistor 73 is connected directly to the emitter of an npn type transistor 75 and through a resistor 76 to ground. The transistors 73 and 75 form a differential amplifier with the collectors being connected to the positive voltage terminal 45 through resistors 77 and 78, respectively. The collector of the transistor 73 is also connected to the base of a pnp type transistor 80, the emitter of which is connected to the collector of the transistor 75 and the collector of which is connected to the base of the transistor 62. The emitter of the transistor 51 is connected through a resistor 83 to ground. The base of the transistor 75, the collector of the transistor 51 and the base and collector of the transistor 50 are connected through a resistor 84 to the positive voltage terminal 45.

In the operation of the circuit illustrated in FIG. 3A, the transistor 56 in series with the current sink formed by the transistors 53 and 54 and resistor 52 and the series transistor 67 form a fixed current sink for the positive input 40 of the operational amplifier 35 and the transistor 61 in series with the current sink formed by the transistors 53 and 54 and resistor 52 and the series transistor 67 form a fixed current sink for the negative input 39 of the operational amplifier 35. The transistors 57 and 58 are connected in a flip-flop configuration so that only one of the transistors 56 or 61 can be conducting at a time. When the transistor 57 is non-conducting the bases of the transistors 56 and 58 are relatively high and transistor 58 is conducting in saturation while transistor 56 is turned on. With the transistor 58 saturated the base of the transistor 61 is near ground and the transistor 61 is non-conducting. With the transistor 56 turned on the positive input 40 of the operational amplifier 35 is drawn down by the fixed current sink action in a step function and the output of the operational amplifier 35 begins to fall linearly in a ramp function, because of the integrating action of the operational amplifier 35. When the output on the terminal 74 reaches a sufficiently low level the transistor 59 goes into saturation and the bases of the transistors 56 and 58 drop to near ground potential causing these transistors to become non-conducting. With the transistor 58 non-conducting, the base of the transistor 61 rises sharply so that the transistor 57 saturates and transistor 61 turns on and drops the negative input 39 of the operational amplifier 35 in a step function. The sudden drop at the negative input 39 causes the output of the operational amplifier 35 to rise linearly. The voltage regulator in the IC chip is temperature compensated. The regulated supply in combination with transistors 50, 51 and resistors 84 and 83 supplies a temperature compensated voltage to the base of transistor 75. The reference voltage at the base of the transistor 75 maintains the transistor 75 conducting and the transistor 73 cut off until the voltage at the output terminal 74 of the operational amplifier 35 reaches a predetermined positive amplitude. As the output of the operational amplifier 35 rises linearly, it will eventually reach a point at which the transistor 73 will conduct and the transistor 75 will be cut off. When the transistor 73 conducts the base of the transistor 80 drops sufficiently to cause conduction therein which will in turn cause transistor 62 to conduct. When a transistor 62 conducts the bases of transistors 57 and 61 are dropped sufficiently to cause these transistors to become non-conducting. With transistor 57 non-conducting, transistor 56 is again biased into conduction and the fixed current sink is applied to the positive input 40 of the operational amplifier 35 causing the output to begin dropping in a linear function. This entire process continues as long as transistor 67 is biased into conduction. When the phase locked loop attains a lock condition the voltage at the terminal 68 drops and the transistor 67 is cut off so that the entire sweep circuit 23 is effectively disconnected from the operational amplifier 35. Because the sweep circuit is effectively disconnected from the operational amplifier, the loop phase detector 11 remains in the center of its transfer characteristic which results in a constant phase detector gain and allows loop bandwidth to be independent of phase detector gain. Further, a transistor junction or diode drop is utilized to sense the lower sweep limit and the temperature compensated reference voltage generator, including transistors 50 and 51, set the upper sweep limit so that the switching points are relatively insensitive to changes in supply voltage, temperature and the like.

Referring specifically to FIG. 3B, the lock detector generally designated 22 has a pair of input terminals 90 and 91 connected to the differential output of the quadrature phase detector 21. The terminals 90 and 91 are connected to the base of a pair of pnp type transistors 92 and 93, respectively. The emitter of the transistor 92 is connected to the collector of an npn type transistor 95 and through a resistor 96 to the positive voltage terminal 45. The emitter of the transistor 92 is also connected through a diode 97 to the emitter of the transistor 93. The emitter of the transistor 93 is also connected to the collector of an npn type transistor 98. The collectors of the transistors 92 and 93 are each connected through approximately equal resistors 101 and 102, respectively, to ground. The collector of transistor 92 is connected to the base of transistor 95. The collector of transistor 93 is connected to the base of transistor 98. The emitter of the transistor 95 is connected through a resistor 103 to the collector of an npn type transistor 104 and the emitter of the transistor 98 is connected through a resistor 105, approximately equal in value to the resistor 103, to the base of the transistor 104. The emitter of the transistor 104 is connected directly to ground. The base of the transistor 104 is also connected to the base and collector of an npn type transistor 110, the emitter of which is connected directly to ground. The output of the lock detector 22 is obtained at the collector of the transistor 104 and appears at the terminal 68, previously described in conjunction with the sweep circuit 23.

In the operation of the lock detector 22, the transistors 92 and 95 form a compound pnp transistor and the transistors 93 and 98 form a compound pnp transistor with the two compound transistors being connected essentially as a differential amplifier so that only one compound transistor will conduct at a time. The diode 97 provides an offset so that transistors 93 and 98 conduct when the terminal 91 is greater than approximately 0.7 volts below the terminal 90. When the potential on terminals 90 and 91 is within 0.7 of the volt difference the phase locked loop is unlocked and transistors 92 and 05 are conducting. Transistors 93 and 98 are cut off so that transistors 104 and 110 are cut off and the current from transistor 95 flows into transistor 67 of the sweep circuit (see FIG. 3A) and the sweep circuit is turned on. When the phase locked loop is locked or essentially locked, the potential difference between terminals 90 and 91 is greater than approximately 0.7 of a volt and transistors 93 and 98 are turned on. With transistors 93 and 98 conducting the transistors 104 and 110 are conducting and the base of transistor 67 in the sweep circuit is essentially grounded so that transistor 67 and, thus, the sweep circuit 23 are turned off.

The ramp generator and gate driver 25 from FIG. 1 are separated, in FIG. 3B, into a ramp generator circuit generally designated 120 and a gate driver circuit generally designated 121. In the ramp generator circuit 120 an npn type transistor 122 has its collector connected through a resistor 123 to the positive voltage terminal 45 and an emitter connected to an output terminal 124, which terminal is connected to the automatic level control circuit 28 (see FIG. 1). The base of the transistor 122 is connected to the collector of an npn type transistor 124 and through a resistor 125 to the positive voltage terminal 45. The base of the transistor 124 is connected to the terminal 69, which is connected to the collector of the transistor 53 in FIG. 3A. The emitter of the transistor 124 is connected to the base of an npn type transistor 126 and through a resistor 127 to ground. The emitter of the transistor 126 is connected directly to ground and the collector is connected directly to the base of an npn type transistor 130. The collector and base of the transistors 126 and 130, respectively, are also connected through a resistor 131 to the emitter of an npn type transistor 132 and through a diode 133 to the base of the transistor 132. The emitter of the transistor 130 is connected directly to ground and the collector is connected through a ramp capacitor 135 (located external to the IC circuit) to ground. The collector of the transistor 130 is also connected to one collector of a dual collector pnp type transistor 136. The collector of the transistor 132 is connected to the base and the other collector of the transistor 136 and the base of the transistor 132 is connected through a resistor 137 to the regulated voltage supply terminal 46. The common collectors of the transistors 130 and 136 are connected to the base of an npn type transistor 140, the collector of which is connected to the base of a pnp type transistor 141. The emitters of the transistors 136 and 141 are connected directly to the positive voltage terminal 45. The emitter of the transistor 140 and the collector of the transistor 141 are connected together and to the base of an npn type transistor 145 in the gate driver 121, the base of which is also connected through a resistor 146 to the emitter thereof. The gate driver circuit 121 will not be described in detail since it includes a pair of linear amplifiers providing outputs for the RF gate 26 at terminals 147 and 148, although only one of the outputs is used, and the operation thereof is relatively straightforward.

In the operation of the ramp generator 120, when transistors 53, 54 and 67 in the sweep circuit 23 (FIG. 3A) turn on the terminal 69 drops and turns off transistor 124. When transistor 124 turns off transistor 126 turns off and transistor 130 turns on the discharge the ramp capacitor 135, thus no ramp is produced and the gate driver circuit 121 receives no drive to turn on the RF gate 26. Further, the transistor 122 turns on and pulls up an input of the automatic level control 28 to turn off the power amplifiers 27 (see FIG. 1). When the transistors 53, 54 and 67 stop conducting turning sweep circuit 23 off, the transistor 124 turns on, which turns off transistor 122 and turns on transistor 126. With transistor 126 turned on transistor 130 is turned off and the ramp capacitor 135 begins to slowly charge through the current source formed by resistor 137, diode 133, transistor 132, resistor 131 and transistor 136. As the ramp capacitor 135 charges it gradually supplies a signal to the gate driver 121 to turn on the RF gate 26. Since the power amplifiers 27 were turned on by the transistor 122 when the sweep circuit 23 turned off, the power amplifiers 27 have had sufficient time to present a good normalized impedance to the RF gate 26. With the charging of the ramp capacitor 135, the RF gate 26 is turned on slowly to ensure that any RF impedance change seen by the voltage controlled oscillator 13 is slow enough for the phase locked loop to compensate and retain lock. If the loop becomes unlocked for any reason transistors 124 and 126 are turned off, turning on transistor 130 which quickly discharges capacitor 135 and shuts off the RF gate 26.

Thus, a novel phase locked loop is disclosed including means for detecting lock and avoiding false lock and for turning on a novel sweep circuit when the loop is not in a lock condition. Further, circuits are disclosed for turning off the power amplifiers and causing an RF gate to attenuate the signal from the VC 0 when the loop is sweeping through its range. The circuits further turn on the power amplifiers and allow then to stabilize, after which the RF gate is gradually closed to prevent the voltage controlled oscillator from being unduly and suddenly loaded, which loading might cause the voltage controlled oscillator to jump out of the lock condition. While an automatic level control circuit 28 is illustrated in conjunction with the power amplifiers 27, it should be understood that the power amplifiers 27 might be operated directly by the gate driver 25 and the automatic level control circuit 28 might be eliminated. In the embodiments illustrated lowside injection techniques are used to obtain the frequency of the reference oscillator, however it should be understood that other mixing techniques, including high-side injection might be used and harmonic or sub-harmonic phase detection can also be incorporated. Further, throughout the schematics illustrated in FIGS. 3A and 3B standard integrated circuit notations are utilized, for example any components which are matched in temperature and other characteristics are connected by a dotted line and any large resistors have a T therein to indicate they are pinched resistors formed by standard IC techniques well known to those skilled in the art.

While we have shown and described specific embodiments of this invention, further modifications and improvements will occur to those skilled in the art. We desire it to be understood, therefore, that this invention is not limited to the particular form shown and we intend in the appended claims to cover all modifications which do not depart from the spirit and scope of this invention.

We claim:

1. A phase locked loop comprising:
   a. a reference oscillator providing an output signal having a fixed predetermined frequency;
   b. a loop phase detector having a first input connected to receive the output signal of said reference oscillator, a second input and an output;
   c. an integrating low pass filter including an operational amplifier having a pair of inputs connected to the output of said loop phase detector and an output;
   d. sweep signal producing means including fixed current sink means connected alternately to each of said inputs of said operational amplifier during unlock conditions of the phase locked loop and disconnected during lock conditions for providing a substantially linear ramp voltage at the output of said low pass filter when said sweep signal producing means is activated;
   e. a voltage controlled oscillator having a control input for controlling the operating frequency thereof connected to the output of said integrating low pass filter and an output having a signal of a predetermined frequency thereon;
   f. a mixer having a first input connected to the output of said voltage controlled oscillator, a second input and an output connected to the second input of said loop phase detector; and
   g. signal providing means connected to the second input of said mixer for supplying a signal thereto having a frequency separated from the frequency of the output signal of said voltage controlled oscillator by the frequency of the output signal of said reference oscillator.

2. A phase locked loop comprising:
   a. a reference oscillator providing an output signal having a fixed predetermined frequency;
   b. a loop phase detector having a first input connected to receive the output signal of said reference oscillator, a second input and an output;
   c. an integrating low pass filter having an input connected to the output of said loop phase detector and an output;
   d. sweep signal producing means connected to said low pass filter for providing a substantially linear ramp voltage at the output of said low pass filter when said sweep signal producing means is activated;
   e. a voltage controlled oscillator having a control input for controlling the operating frequency thereof connected to the output of said integrating low pass filter and an output having a signal of a predetermined frequency thereon;
   f. a mixer having a first input connected to the output of said voltage controlled oscillator, a second input and an output connected to the second input of said loop phase detector;
   g. signal providing means connected to the second input of said mixer for supplying a signal thereto having a frequency separated from the frequency of the output signal of said voltage controlled oscillator by the frequency of the output signal of said reference oscillator;
   h. a quadrature phase detector including a 90° phase shifter connecting the output signal of said reference oscillator to a first input of said quadrature phase detector, a second input being connected to the output of said mixer and an output;
   i. a lock detector having an input connected to the output of said quadrature phase detector and an output connected to said sweep signal producing means for activating the sweep signal producing means during unlock conditions of the phase locked loop;
   j. a gate circuit connected to the output of said voltage controlled oscillator for connecting the signal therefrom to a suitable load when said gate circuit is activated; and
   k. a ramp generator having an input coupled to receive an indication of a lock condition from said lock detector and an output connected to said gate circuit for causing said ramp generator to supply a ramp output signal to said gate circuit upon an indication of a lock condition in the phase locked loop, which ramp gradually activates said gate circuit.

3. A phase locked loop as claimed in claim 2 wherein the suitable load connected to the voltage controlled oscillator by the gate circuit includes power amplifiers having an output coupled to an antenna, said power amplifiers having an activating input coupled to the ramp generator for activating said power amplifiers prior to supplying the ramp output signal to said gate circuit.

4. A phase locked loop as claimed in claim 2 wherein the integrating low pass filter includes an operational amplifier having a pair of inputs and the sweep signal producing means includes fixed current sink means connected alternately with each of said inputs of said operational amplifier during unlock conditions of tthe phase locked loop and disconnected during lock conditions.

5. A phase locked loop as claimed in claim 2 wherein the signal providing means includes a multiplying circuit having an input connected to the output of the reference oscillator and an output connected to the mixer.

6. A phase locked loop as claimed in claim 2 wherein the signal providing means includes a source of signals having a variable frequency output.

7. A sweep signal producing circuit for a phase locked loop comprising:
   a. integrating, low pass filter means including an operational amplifier having a pair of inputs and an output;
   b. fixed current sink means connected to the inputs of said operational amplifier via flip-flop action for reducing input signals applied thereto in a substantially step function; and
   c. means having an input and associated with said fixed current sink means for activating and deactivating said sink in response to a predetermined signal applied to the input thereof.

8. A phase locked loop comprising:
   a. a reference oscillator providing an output signal having a fixed predetermined frequency;
   b. a loop phase detector having a first input connected to receive the output signal of said reference oscillator, a second input and an output;
   c. an integrating low pass filter having an input connected to the output of said loop phase detector and an output;
   d. sweep signal producing means connected to said low pass filter for providing a substantially linear ramp voltage at the output of said low pass filter when said sweep signal producing means is activated;

e. a voltage controlled oscillator having a control input for controlling the operating frequency thereof connected to the output of said integrating low pass filter and an output having a signal of a predetermined frequency thereon;

f. a mixer having a first input connected to the output of said voltage controlled oscillator, a second input and an output connected to the second input of said loop phase detector;

g. signal providing means connected to the second input of said mixer for supplying a signal thereto having a frequency separated from the frequency of the output signal of said voltage controlled oscillator by the frequency of the output signal of said reference oscillator;

h. a gate circuit connected to the output of the voltage controlled oscillator for connecting the signal therefrom to a suitable load when said gate circuit is activated;

i. a lock detector coupled to the phase lock loop and providing an indication of a lock condition; and j. a ramp generator having an input coupled to receive the indication of a lock condition from said lock detector and an output connected to said gate circuit for causing said ramp generator to supply a ramp output signal to said gate circuit upon an indication of a lock condition in the phase locked loop, which ramp gradually activates said gate circuit.

* * * * *